(12) United States Patent
Na

(10) Patent No.: US 8,633,072 B2
(45) Date of Patent: Jan. 21, 2014

(54) METHOD OF MANUFACTURING SEMICONDUCTOR DEVICE

(71) Applicant: Electronics and Telecommunications Research Institute, Daejeon (KR)

(72) Inventor: Kyoung Il Na, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/723,674

(22) Filed: Dec. 21, 2012

(65) Prior Publication Data

US 2013/0309824 A1 Nov. 21, 2013

(30) Foreign Application Priority Data

May 18, 2012 (KR) .................. 10-2012-0053276

(51) Int. Cl.
 *H01L 21/336* (2006.01)
(52) U.S. Cl.
 USPC ........... 438/257; 438/259; 438/270; 438/201; 438/211; 257/331; 257/332; 257/135; 257/315
(58) Field of Classification Search
 USPC ....... 438/FOR. 203, 257, 259, 260, 265, 268, 438/299, 267, 270, 201, 203, 204, 211, 212, 438/593, 303, 305, 302; 257/327, 328, 329, 257/330, 331, 332, 315, 341, 302, 401, 134, 257/135, 520
 See application file for complete search history.

(56) References Cited

U.S. PATENT DOCUMENTS

| | | | | |
|---|---|---|---|---|
| 6,812,525 B2 * | 11/2004 | Bul et al. | ....................... | 257/341 |
| 7,355,257 B2 | 4/2008 | Kishimoto et al. | | |
| 7,709,889 B2 | 5/2010 | Moens et al. | | |
| 8,159,039 B2 * | 4/2012 | Cheng | ........................... | 257/506 |
| 2005/0170587 A1 * | 8/2005 | Izumisawa et al. | ........... | 438/270 |
| 2005/0242411 A1 * | 11/2005 | Tso | ............................... | 257/480 |

OTHER PUBLICATIONS

P. Moens et al., "XtreMOS: The First Integrated Power Transistor Breaking the Silicon Limit", International Electron Devices Meeting IEDM '06, Dec. 11-13, 2006, pp. 1-4, IEEE.
M. A. Gajda et al., "Industrialisation of Resurf Stepped Oxide Technology for Power Transistors", 18$^{th}$ International Symposium on Power Semiconductor Devices and IC's, Jun. 4-8, 2006, pp. 1-4, IEEE.
Jun Sakakibara et al., "600V-class Super Junction MOSFET with High Aspect Ratio P/N Columns Structure", 20$^{th}$ International Symposium on Power Semiconductor Devices and IC's, May 18-22, 2008, pp. 229-302, IEEE.

* cited by examiner

*Primary Examiner* — Thanh Y Tran

(57) ABSTRACT

Provided is a method of manufacturing a semiconductor device. The method may include etching a first conductive type semiconductor substrate to form a first trench, forming a second trench extending from the first trench, diffusing impurities into inner walls of the second trench to form a second conductive type impurity region surrounding the second trench, forming a floating dielectric layer covering inner walls of the second trench and a floating electrode filling the second trench, and forming a gate dielectric layer covering inner walls of the first trench and a gate electrode filling the first trench.

14 Claims, 5 Drawing Sheets

METHOD OF MANUFACTURING SEMICONDUCTOR DEVICE

CROSS-REFERENCE TO RELATED APPLICATIONS

This U.S. non-provisional patent application claims priority under 35 U.S.C. §119 of Korean Patent Application No. 10-2012-0053276, filed on May 18, 2012, the entire contents of which are hereby incorporated by reference.

BACKGROUND

The present invention disclosed herein relates to a method of manufacturing a semiconductor device, and more particularly, to a method of manufacturing a power semiconductor device.

Power semiconductor devices are high-voltage, large-current power switching devices required for high-voltage, large-current power modules for driving motors of automobiles, and industrial and information-telecommunication devices. In a vertical type metal oxide silicon field effect transistor (MOSFET) device among various power semiconductor devices, trenches are formed in a substrate and gates are formed in the trenches. A characteristic of the vertical type MOSFET is that a current vertically flows through a channel perpendicular to a top surface of the substrate of the vertical type MOSFET. As a result, high channel current density may be obtained. Also, a MOSFET device used for a power semiconductor device has a super-junction structure. The super-junction structure has a P-N junction structure or vertical field plate structure.

SUMMARY

The present invention provides a method of manufacturing a semiconductor device, in which a manufacturing process is improved.

The object of the present invention is not limited to the aforesaid, but other objects not described herein will be clearly understood by those skilled in the art from descriptions below.

Embodiments of the present invention provide methods of manufacturing a semiconductor device including: etching a first conductive type semiconductor substrate to form a first trench; forming a second trench extending from the first trench; diffusing impurities into inner walls of the second trench to form a second conductive type impurity region surrounding the second trench; forming a floating dielectric layer covering inner walls of the second trench and a floating electrode filling the second trench; and forming a gate dielectric layer covering inner walls of the first trench and a gate electrode filling the first trench.

In some embodiments, the forming of the second trench may include forming a protective layer covering the inner walls of the first trench on the semiconductor substrate, removing the protective layer covering a lower surface of the first trench to expose the lower surface of the first trench, and etching the semiconductor substrate exposed at the lower surface of the first trench.

In other embodiments, the method may further include removing the protective layer covering sidewalls of the first trench after forming the impurity region.

In still other embodiments, the forming of the impurity region may include forming a second conductive type impurity layer covering the inner walls of the second trench, and heat treating the impurity layer to diffuse impurities included in the impurity layer around the second trench.

In even other embodiments, the impurity layer may include any one of boron (B), aluminum (Al), gallium (Ga), and indium (In).

In yet other embodiments, the impurity layer may include any one of nitride (N), phosphorus (P), arsenic (As), and antimony (Sb).

In further embodiments, the impurity layer may be removed after the impurity region is formed.

In still further embodiments, the method may further include forming a first conductive type drain region under the semiconductor substrate.

In even further embodiments, the impurity region and the floating dielectric layer may be formed to be in contact with the drain region.

In yet further embodiments, the impurity region and the floating dielectric layer may be formed to be spaced apart from the drain region.

In much further embodiments, the method may further include: forming a channel region in contact with the impurity region in the semiconductor substrate and having a depth corresponding to the first trench; forming a first conductive type source region formed on the channel region, spaced apart from the impurity region, and in contact with sidewall portions of the first trench; forming a second conductive type source region spaced apart from the sidewalls of the first trench on the channel region; forming a source electrode in contact with the semiconductor substrate; and forming a drain electrode in contact with the drain region under the semiconductor substrate.

In still much further embodiments, the floating dielectric layer may be formed to be thicker than the gate dielectric layer.

In even much further embodiments, the floating dielectric layer may be formed by any one of thermal oxidation and chemical vapor deposition.

In yet much further embodiments, the floating dielectric layer may be any one of an oxide layer, a nitride layer, and a multilayer including an oxide layer and a nitride layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE EMBODIMENTS

Figure 1A:
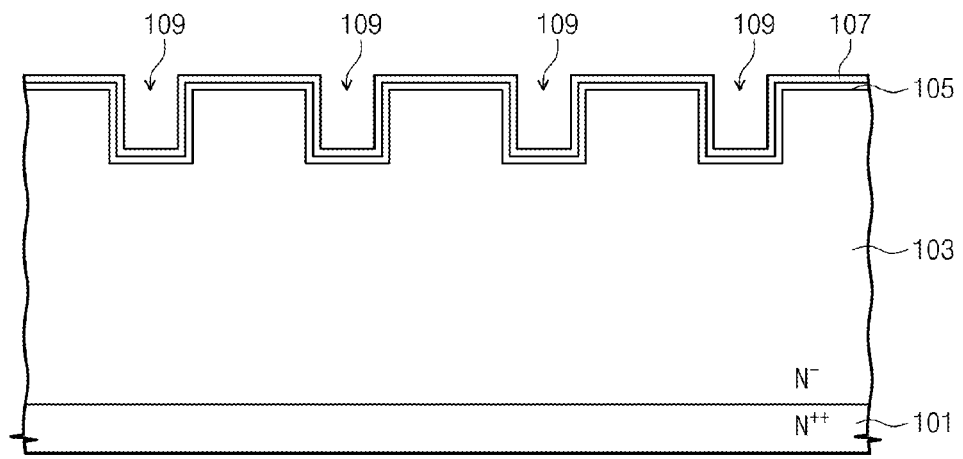
FIGS. 1A through 1H are cross-sectional views illustrating a method of manufacturing a semiconductor device according to an embodiment of the present invention.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. In the drawings, like reference numerals refer to like elements throughout.

In the following description, the technical terms are used only for explaining a specific exemplary embodiment while not limiting the present invention. The terms of a singular form may include plural forms unless referred to the contrary. The meaning of "comprises" and/or "comprising" specifies a property, a region, a fixed number, a step, a process, an element and/or a component but does not exclude other properties, regions, fixed numbers, steps, processes, elements and/or components.

Additionally, the embodiment in the detailed description will be described with sectional views and/or plan views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Thus, this should not be construed as limited to the scope of the present invention.

FIGS. 1A through 1H are cross-sectional views illustrating a method of manufacturing a semiconductor device according to an embodiment of the present invention.

Referring to FIG. 1A, a first conductive type semiconductor substrate 103 is prepared. The semiconductor substrate 103 may include a first conductive type drain region 101 doped in a concentration higher than that of the semiconductor substrate 103 under the semiconductor substrate 103. The semiconductor substrate 103, for example, may be an N-type doped semiconductor substrate.

A first trenches 109 may be formed by patterning the semiconductor substrate 103. Specifically, the first trenches 109 may be formed by forming a mask pattern (not shown) on the semiconductor substrate 103 and etching the semiconductor substrate 103 exposed through the mask pattern (not shown). The first trenches 109 may be formed through anisotropic etching or isotropic etching of the semiconductor substrate 103 by using any one of wet etching method or dry etching method. The mask pattern (not shown) may be removed after the first trenches 109 are formed.

A protective layer covering inner walls of the first trenches 109 may be conformally formed on the semiconductor substrate 103. The protective layer may include an oxide layer 105 and a nitride layer 107. The oxide layer 105 may be naturally formed on the semiconductor substrate 103 when exposed in the air. The nitride layer 107 may be formed on the oxide layer 105 by chemical vapor deposition (CVD), physical vapor deposition (PVD), and atomic layer deposition (ALD).

Figure 1B:
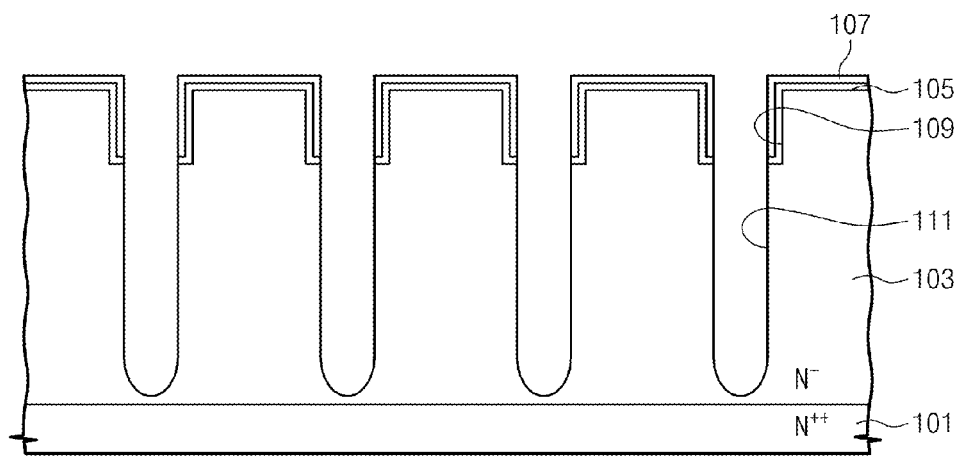

Referring to FIG. 1B, second trenches 111 extending from bottoms of the first trenches 109 may be formed by etching lower surfaces of the first trenches 109.

The forming of the second trenches 111 may include forming a mask pattern (not shown) on the nitride layer 107 so as to expose the first trenches 109, etching the protective layer formed on the lower surfaces of the first trenches 109, and etching the semiconductor substrate 103 exposed at the lower surfaces of the first trenches 109.

The second trenches 111 may be anisotropically etched or isotropically etched by using a wet etching method or dry etching method. A width of the second trenches 111 may be equal to or smaller than that of the first trenches 109. Also, the width of the second trenches 111 may be greater than that of the first trenches 109. The mask pattern (not shown) may be removed after the second trenches 111 are formed.

Figure 1C:
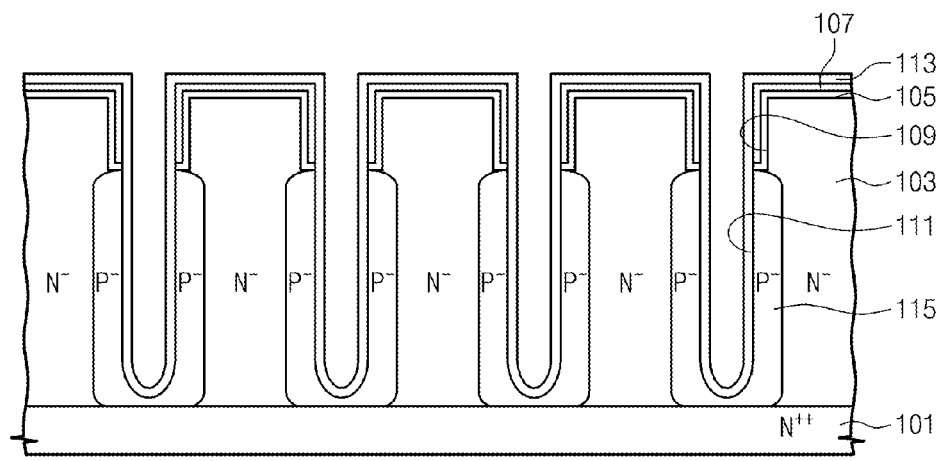

Referring to FIG. 1C, second conductive type impurity regions 115 may be formed by performing a heat treatment process after a second conductive type impurity layer 113 is formed on inner walls of the second trenches 111.

The impurity layer 113 may be formed on the inner walls of the second trenches 111. The impurity layer 113 may be formed on the inner walls of the first trenches 109 and the nitride layer 107 by extending from the inner walls of the second trenches 111. The impurity layer 113 may be formed by using a chemical vapor deposition method and for example, may be formed by using an atmospheric pressure chemical vapor deposition method. The impurity layer 113 may be a layer including a P-type impurity and for example, may be a boron silicate glass (BSG) layer, a boron phosphorus silicate glass (BPSG) layer, and a layer including any one of boron, aluminum, and gallium. Alternatively, when the semiconductor substrate 103 is P-type, the impurity layer 113 may include an N-type impurity, and for example, may include any one of nitride, phosphorus, arsenic, and antimony.

The impurity regions 115 may be formed by performing a heat treatment process on the impurity layer 113 to diffuse impurities included in the impurity layer 113 into the semiconductor substrate 103. The impurity regions 115 may be formed to surround sidewalls of the second trenches 111. The impurity regions 115 may be in contact with the drain region 101. The heat treatment process may be performed at a temperature within a range of about 800° C. to about 1150° C. Impurities included in the impurity layer 113 formed on sidewalls of the first trenches 109 may not be diffused into the semiconductor substrate 103 due to the nitride layer 107 during the heat treatment process. Therefore, the impurities may be horizontally diffused into the semiconductor substrate 103 around the second trenches 111.

Meanwhile, when a super-junction using a P-N junction is formed in a semiconductor substrate, a P-type impurity region may be formed in an N-type semiconductor substrate by using an impurity ion implantation or epitaxial growth method. However, in these cases, concentration of the doped impurity region may be non-uniform or processing costs may increase.

In contrast, the impurity regions 115 having a uniform concentration may be formed by horizontally diffusing the impurities in the impurity layer 113 into the semiconductor substrate 103. Therefore, when the impurities are P-type impurities and the semiconductor substrate 103 is N-type, a P-N junction having a uniform concentration may be formed. As a result, processing may be possible at a lower cost and a power semiconductor device having improved reliability may be formed.

Figure 1D:
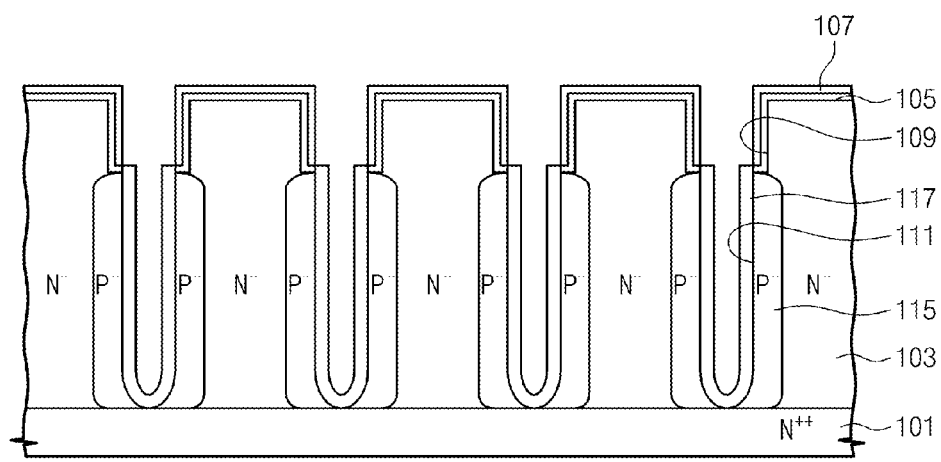

Referring to FIG. 1D, the impurity layer 113 may be removed. The impurity layer 113 may be removed by using a wet etching method or dry etching method. The impurity layer 113 is removed and thus, the inner walls of the second trenches 111 may be exposed.

A floating dielectric layer 117 may be formed on the inner walls of the second trenches 111 exposed by the removal of the impurity layer 113. The floating dielectric layer 117 may be formed by thermal oxidation or chemical vapor deposition. The floating dielectric layer 117 may be in contact with the drain region 101. The floating dielectric layer 117 may be formed to a thickness range of about 0.1 μm to about 1 μm. The thickness of the floating dielectric layer 117 may be differently formed according to a size of the semiconductor device or a breakdown voltage of the semiconductor device. The floating dielectric layer 117 may be an oxide layer, a nitride layer, and a multilayer including oxide layer and nitride layer.

Figure 1E:
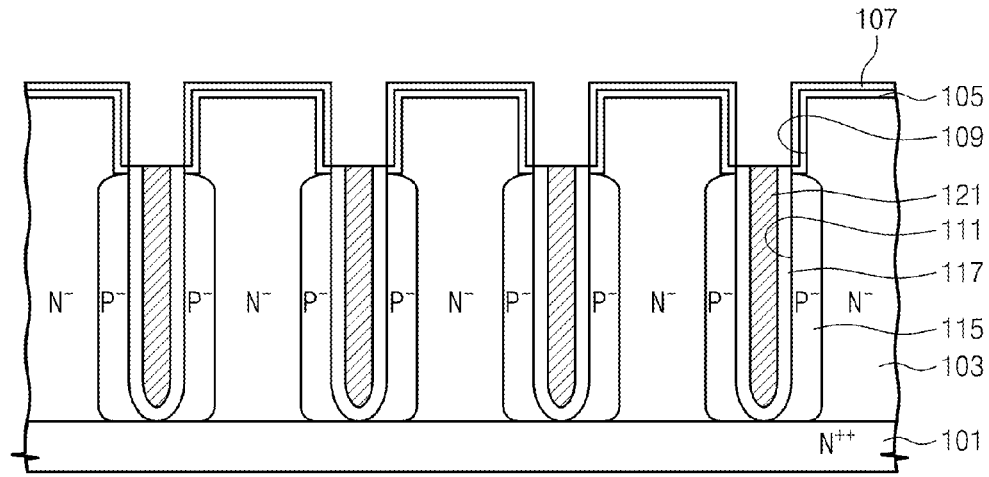

Referring to FIG. 1E, floating electrodes 121 may be formed in the second trenches 111 having the floating dielectric layer 117 formed therein.

More particularly, a floating electrode layer (not shown) may fill the second trenches 111. The floating electrode layer (not shown) may cover the nitride layer 107 formed on the semiconductor substrate 103. The floating electrode layer (not shown) may be formed by any one of CVD, PVD, and ALD.

The floating electrodes 121 may be formed by etching a portion of the floating electrode layer (not shown) formed on the nitride layer 107 and in the first trenches 109. The floating electrode layer (not shown) may be etched by using any one of an etch back process, a wet etching method, and a dry etching method. The floating electrode 121 may be formed of polysilicon or a metallic material. The metallic material may be copper (Cu), tungsten (W), titanium (Ti), or aluminum (Al).

Figure 1F:
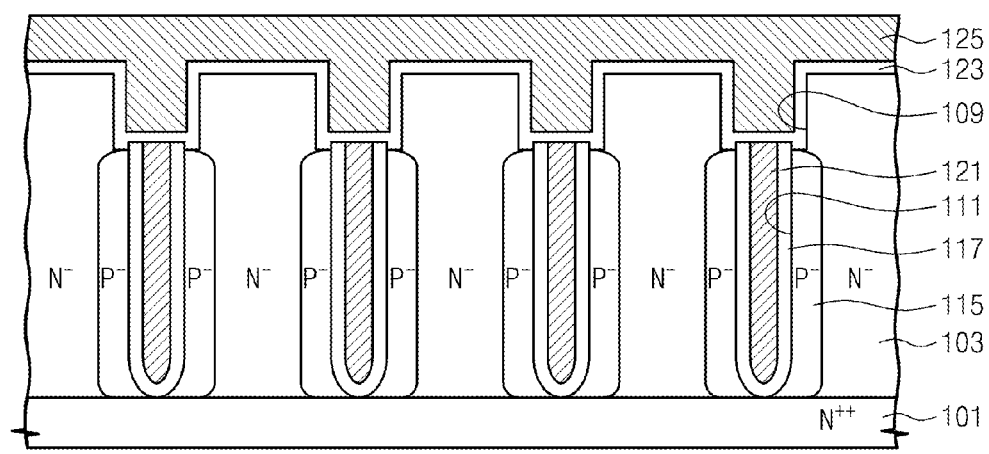

Referring to FIG. 1F, the oxide layer 105 and the nitride layer 107 formed on the sidewalls of the first trenches 109 and the semiconductor substrate 103 may be removed. The oxide layer 105 and the nitride layer 107 may be removed by using a wet etching method or dry etching method. The oxide layer 105 and the nitride layer 107 are removed and thus, the sidewalls of the first trenches 109 and an upper surface of the first conductive type semiconductor substrate 103 may be exposed.

The oxide layer 105 and the nitride layer 107 are removed and then a gate dielectric layer 123 may be conformally formed to cover the exposed upper surface of the first conductive type semiconductor substrate 103 and sidewalls of the first trenches 109. The gate dielectric layer 123 may be formed by any one of CVD, PVD, ALD, and thermal oxidation. The gate dielectric layer 123 may be formed to be thinner than the floating dielectric layer 117.

A gate electrode layer 125 filling the first trenches 109 having the gate dielectric layer 123 formed thereon may be formed. The gate electrode layer 125 may be formed by any one of CVD, PVD, and ALD. The gate electrode layer 125 may be formed of polysilicon or a metallic material. The metallic material may be Cu, W, Ti, or Al.

Figure 1G:
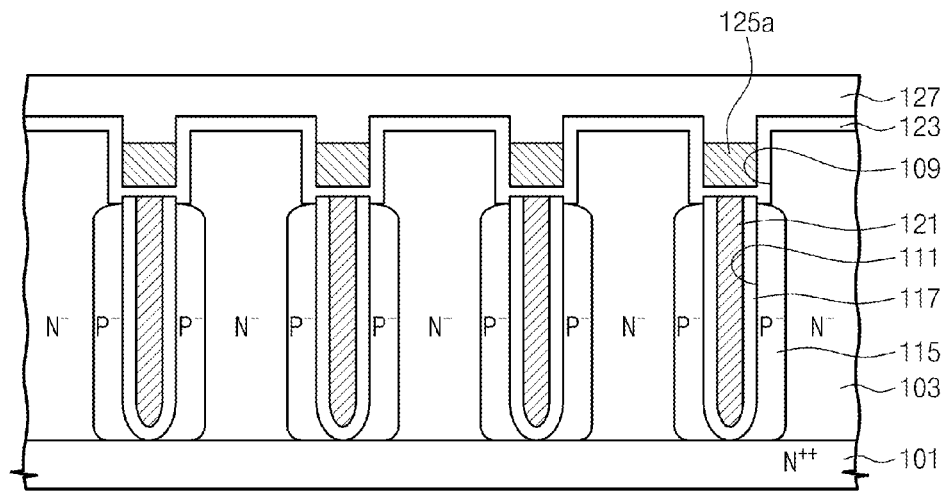

Referring to FIG. 1G, gate electrodes 125a may be formed in the first trenches 109 by etching the gate electrode layer 125. The gate electrode layer 125 may be etched by using any one of an etch back process, a wet etching method, and a dry etching method. As a result, the gate dielectric layer 123 formed on the semiconductor substrate 103 may be exposed. Also, portions of the gate electrode layer 125 filled in the first trenches 109 are etched and thus, upper portions of the first trenches 109 may be exposed. Specifically, an upper surface of the gate electrodes 125a may be lower than that of the first conductive type semiconductor substrate 103.

Subsequently, a passivation layer 127 may be formed to cover the upper surfaces of the gate electrodes 125a and the upper surface of the gate dielectric layer 123. That is, the passivation layer 127 may be formed to fill the upper portions of the first trenches 109. The passivation layer 127 may be formed by any one method of CVD, PVD, and ALD. The passivation layer 127 may be an oxide layer or nitride layer.

Figure 1H:
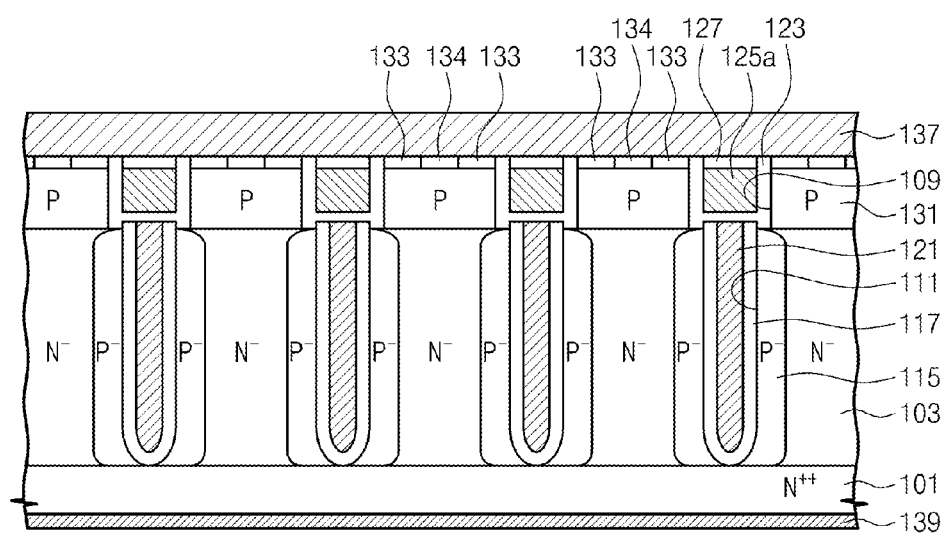

Referring to FIG. 1H, channel regions 131 may be formed in an upper portion of the semiconductor substrate 103. The forming of the channel regions 131 may include forming a photoresist pattern (not shown) on an upper surface of the passivation layer 127, patterning the passivation layer 127 exposed through the photoresist pattern (not shown), and forming the channel regions 131 in the semiconductor substrate 103 exposed by the patterning of the passivation layer 127.

The forming of the photoresist pattern (not shown) may be performed by using a lithography process after the upper surface of the passivation layer 127 is coated with a photoresist layer. The photoresist pattern (not shown) may be formed on the upper portions of the first trenches 109.

The patterning of the passivation layer 127 is performed through removing the passivation layer 127 not having the photoresist pattern (not shown) formed thereon by using any one of a wet etching method or a dry etching method. When the passivation layer 127 is removed, the gate dielectric layer 123 is simultaneously removed and thus, the upper surface of the semiconductor substrate 103 may be exposed.

The forming of the channel regions 131 in the semiconductor substrate 103 exposed by the patterning of the passivation layer 127 may be performed on the exposed semiconductor substrate 103 by using any one of an ion implantation, thermal diffusion, or plasma doping method. The channel regions 131 are in contact with the impurity regions 115 and may be formed to have the same depth as that of the first trenches 109. The channel regions 131 may be formed by being doped with a P-type impurity. The P-type impurity may be any one of boron, aluminum, and gallium.

First conductive type source regions 133 may be formed on the channel regions 131. The first conductive type source regions 133 are spaced apart from the impurity regions 115 and may be formed to be in contact with sidewall portions of the first trenches 109. The first conductive type source regions 133 may be formed by being doped with an N-type impurity. The N-type impurity may be any one of nitride, phosphorus, arsenic, and antimony.

Second conductive type source regions 134 may be formed on the channel regions 131. The second conductive type source regions 134 are spaced apart from the impurity regions 115 and may be formed to be spaced apart from the sidewall portions of the first trenches 109. The second conductive type source regions 134 may be formed by being doped with a P-type impurity. The P-type impurity may be any one of boron, aluminum, and gallium.

The passivation layer 127 unremoved by the photoresist pattern (not shown) may be removed by any one method of wet etching, dry etching, and chemical mechanical polishing. In contrast, the passivation layer 127 filled in the first trenches 109 may remain. The gate dielectric layer 123 may be simultaneously removed while the passivation layer 127 is removed. Therefore, the upper surface of the semiconductor substrate 103 having the first conductive type source regions 133 and the second conductive type source regions 134 formed thereon may be exposed.

A source electrode 137 may be formed on the upper surface of the semiconductor substrate 103. The source electrode 137 may be formed by any one method of chemical vapor deposition, physical vapor deposition, and atomic layer deposition. The source electrode 137 may be a metallic material. The metallic material may be Cu, W, Ti, Al, silver (Ag), or gold (Au).

A drain electrode 139 may be formed on a bottom surface of the drain region 101. The drain electrode 139 may be formed by any one method of chemical vapor deposition, physical vapor deposition, and atomic layer deposition. The drain electrode 139 may be a metallic material. The metallic material may be Cu, W, Ti, Al, Ag, or Au.

Figure 2:
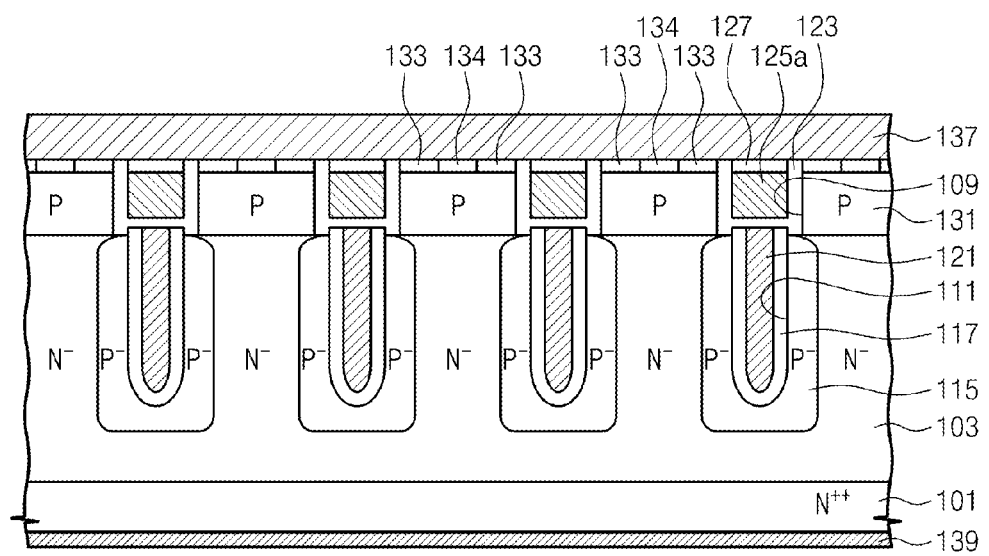
FIG. 2 is a cross-sectional view illustrating a semiconductor device according to another embodiment of the present invention.

FIG. 2 is a cross-sectional view illustrating a semiconductor device according to another embodiment of the present invention.

Referring to FIG. 2, second conductive type impurity regions 115 may be formed to surround sidewalls of second trenches 111 and may be spaced apart from the first conductive type drain region 101. As a result, a floating dielectric layer 117 may be formed in the impurity regions 115 and the floating dielectric layer 117 may be spaced apart from the drain region 101.

When the impurity regions 115 are spaced apart from the drain region 101, the gate charge may decrease in comparison to the case in which the impurity regions 115 are in contact with the drain region 101. As a result, the breakdown voltage may decrease in comparison to that of a powder semiconductor device, in which the second conductive type impurity regions 115 and the drain region 101 are in contact with one other.

In a method of manufacturing a semiconductor device according to an embodiment of the present invention, a second conductive type impurity layer is formed on inner walls of the second trenches and then impurities included in the impurity layer are diffused into a semiconductor substrate to form second conductive type regions in the semiconductor substrate. As a result, the second conductive type regions having a uniform concentration may be formed. Therefore, a P-N junction having a uniform concentration may be formed in the semiconductor substrate.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, the preferred embodiments should be considered in descriptive sense only and not for purposes of limitation.

What is claimed is:

1. A method of manufacturing a semiconductor device, the method comprising:
   etching a first conductive type semiconductor substrate to form a first trench;
   forming a second trench extending from the first trench;
   diffusing impurities into inner walls of the second trench to form a second conductive type impurity region surrounding the second trench;
   forming a floating dielectric layer covering inner walls of the second trench and a floating electrode filling the second trench; and
   forming a gate dielectric layer covering inner walls of the first trench and a gate electrode filling the first trench.

2. The method of claim 1, wherein the forming of the second trench comprises:
   forming a protective layer covering the inner walls of the first trench on the semiconductor substrate;
   removing the protective layer covering a lower surface of the first trench to expose the lower surface of the first trench; and
   etching the semiconductor substrate exposed at the lower surface of the first trench.

3. The method of claim 2, further comprising removing the protective layer covering sidewalls of the first trench after forming the impurity region.

4. The method of claim 1, wherein the forming of the impurity region comprises:
   forming a second conductive type impurity layer covering the inner walls of the second trench; and
   heat treating the impurity layer to diffuse impurities included in the impurity layer around the second trench.

5. The method of claim 4, wherein the impurity layer comprises any one of boron (B), aluminum (Al), gallium (Ga), and indium (In).

6. The method of claim 4, wherein the impurity layer comprises any one of nitride (N), phosphorus (P), arsenic (As), and antimony (Sb).

7. The method of claim 4, wherein the impurity layer is removed after the impurity region is formed.

8. The method of claim 1, further comprising forming a first conductive type drain region under the semiconductor substrate.

9. The method of claim 8, wherein the impurity region and the floating dielectric layer are formed to be in contact with the drain region.

10. The method of claim 8, wherein the impurity region and the floating dielectric layer are formed to be spaced apart from the drain region.

11. The method of claim 8, further comprising:
   forming a channel region in contact with the impurity region in the semiconductor substrate and having a depth corresponding to the first trench;
   forming a first conductive type source region formed on the channel region, spaced apart from the impurity region, and in contact with sidewall portions of the first trench;
   forming a second conductive type source region spaced apart from the sidewalls of the first trench on the channel region;
   forming a source electrode in contact with the semiconductor substrate; and
   forming a drain electrode in contact with the drain region under the semiconductor substrate.

12. The method of claim 1, wherein the floating dielectric layer is formed to be thicker than the gate dielectric layer.

13. The method of claim 1, wherein the floating dielectric layer is formed by any one of thermal oxidation and chemical vapor deposition.

14. The method of claim 1, wherein the floating dielectric layer is any one of an oxide layer, a nitride layer, and a multilayer comprising an oxide layer and a nitride layer.

* * * * *